April 18, 1961 J. J. OLIVER ET AL 2,980,859

ELECTRICAL CIRCUITS FOR PULSE GENERATION

Filed Oct. 14, 1953 2 Sheets-Sheet 1

INVENTORS
JOSEPH J. OLIVER
LOUIS H. MORRISON
BY Their Attorney
Elmer J. Gorn

ELECTRICAL CIRCUITS FOR PULSE GENERATION

Filed Oct. 14, 1953 2 Sheets-Sheet 2

INVENTORS
JOSEPH J. OLIVER
LOUIS H. MORRISON
BY Their Attorney
Elmer J. Gorn

United States Patent Office 2,980,859

Patented Apr. 18, 1961

2,980,859

ELECTRICAL CIRCUITS FOR PULSE GENERATION

Joseph J. Oliver, Allston, and Louis H. Morrison, Waban, Mass., assignors to Raytheon Company, a corporation of Delaware Filed Oct. 14, 1953, Ser. No. 385,966

5 Claims. (Cl. 328—258)

This invention pertains to high-voltage oscillators and in particular to such oscillators as are driven by pulsed signals.

In the field of communications it has become increasingly important to transmit powerful pulsed signals at radio frequencies. Transmitting media having suitable power include such high voltage electronic tubes as magnetrons and klystrons. Previously described systems for transmitting pulsed signals have usually involved amplification of the desired pulses followed by direct coupling to the oscillator. However, such circuitry has not been fully effective because of the characteristic responses of such high-voltage oscillators.

Among the inherent characteristics of a magnetron, for example, is its sensitivity to the applied voltage. Below a critical voltage, usually a few percent below the "operating voltage," the magnetron conducts very little. If the applied voltage is substantially equal to the operating voltage, the magnetron will operate in the desired mode, in which a further small change in voltage will result in a very large change in current. It is usually preferred to operate the magnetron at an "operating point" wherein both current and voltage are held constant.

If the initially applied voltage is considerably above the operating voltage, the magnetron will most likely operate in an entirely different and usually undesirable mode. One example is "mode skip" in which a magnetron is driven alternately between a desired oscillating mode and an undesired mode. Such a "skip" is normally curable by reducing the rate of rise of the applied voltage, reducing the magnitude of the applied voltage or by reducing the radio-frequency loading on the magnetron, all of which tend to decrease usefulness.

Another problem associated with previously described pulse conversion circuits for high-voltage oscillators has been the effect of stray capacitance. In the normal operation of magnetrons there is a stray capacitance associated with the magnetron and its circuit components. The energy required to cause the magnetron to conduct during a single pulse also includes the energy necessary to charge the stray capacitance in such a manner that the power requirement to supply and remove the energy from the capacitance may be of the same order of magnitude as the useful power. Thus, when the magnetron is driven by the usual pulse-amplifier circuit this stray capacitance limits the speed of rise times, requires large-size components and yields a low efficiency.

With the present invention, a gated pedestal pulse is provided which supplies sufficient energy to the stray capacitance of the magnetron so that the voltage is just below the operating voltage, as previously described. As soon as or during the time this pedestal pulse has reached its peak, a signal pulse is applied which is substantially equal to the operating voltage. However, this signal pulse is virtually all useful power, except for leakage, since the pedestal pulse maintains a charge across the stray capacitance. Thus, if there is more than one signal per group, there is a saving of energy in not requiring additional charging and discharging of the stray capacitance. The present invention provides a method for obtaining fast-rise times when the normal pulse peak current would not raise the voltage of the stray capacity across the magnetron with the necessary speed. In doing so, this method also removes all voltages with associated radio-frequency noise during inter-pulse periods so that the receiver effectiveness is not impaired.

This invention may be more clearly understood by reference to a preferred embodiment in which Fig. 1 is a partial schematic and block diagram of a driving circuit incorporating this invention.

Figure 1:
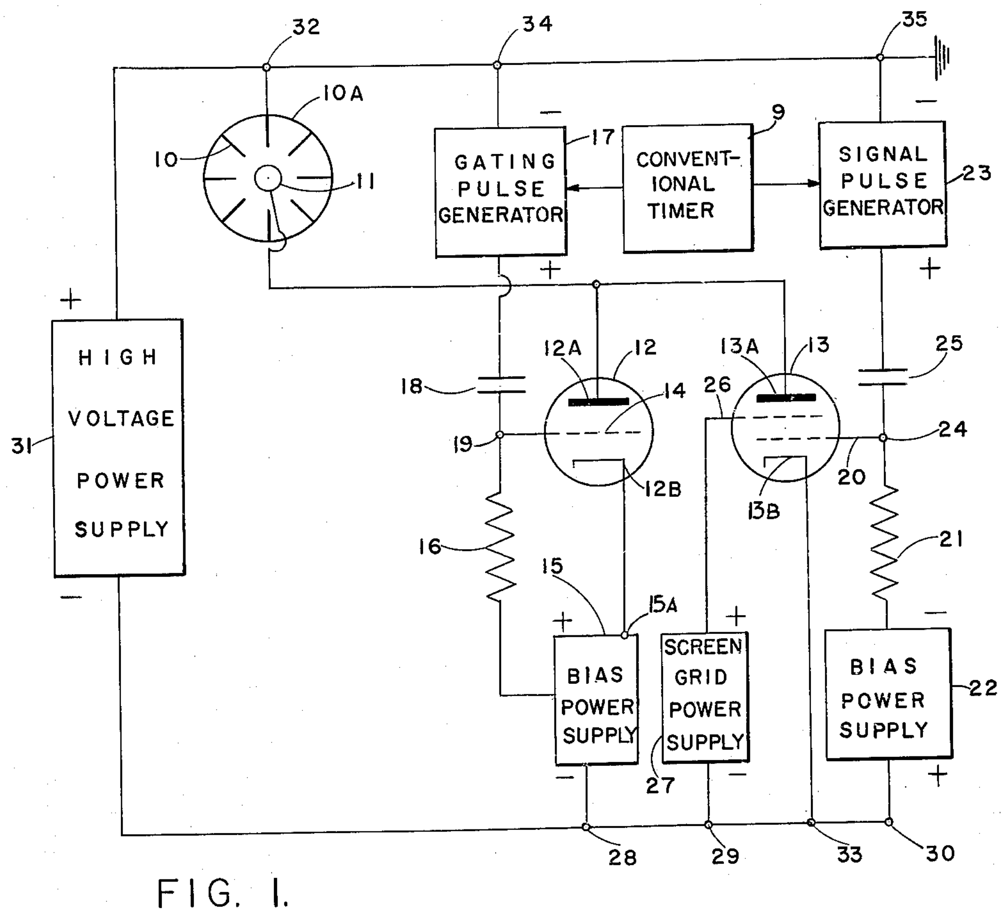

Referring now to Fig. 1, we have a magnetron 10 capable of being pulse-driven, and having its cathode 11 connected with both plates 12A and 13A of triode 12 and tetrode 13, the triode and tetrode circuits being in parallel with one another. The grid 14 of triode 12 is connected via a resistance 16 with an independent power supply 15 which supplies it with bias. The grid 14 is responsive to a pedestal gating pulse generator 17 connected to it at junction 19 via a capacitance 18. Tetrode 13 has its grid 20 connected via resistance 21 to an independent power supply 22. Grid 20 is responsive to a signal pulse generator 23 connected to it at junction 24 via capacitance 25. The screen grid 26 receives its potential from power supply 27.

Figure 2:
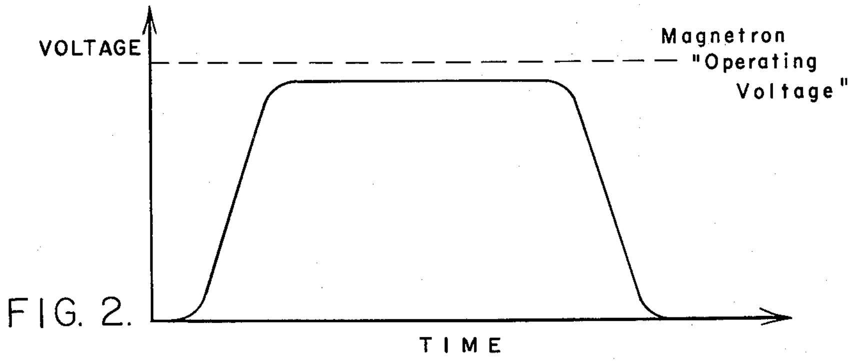
Fig. 2 is a voltage-time curve for a typical gating pulse.

The cathode 12B of triode 12 is connected at a point 15A on the power supply 15 so that the grid 14 is negative with respect to cathode 12B. The negative terminal of power supplies 15 and 27 and the positive terminal of power supply 22 are connected via junctions 28, 29 and 30 with the negative terminal of the current high-voltage power supply 31. The positive end of supply 31 is connected via junction 32 with the plate 10A of magnetron 10 and also to ground. The cathode 13B of tetrode 13 is connected via junction 33 to the negative side of the circuit power supply 31. The negative sides of the gate generator 17 and signal generator 23 are connected via junctions 34 and 35 to the positive-ground side of power supply 31. Both tubes 12 and 13 are normally negatively biased to cut-off so that there is no conduction through magnetron 10 except with pulsing. When a positive gating pulse is applied to the circuit by the pedestal gate generator 17, the negative bias on tube 12 is overcome and tube 12 conducts for the period of the pulse. In thus conducting a voltage nearly equal to the negative high voltage from the power supply 31 less the voltage of the power supply 15 is applied to cathode 11 of magnetron 10. By proper choice of voltages in these power supplies the magnetron cathode voltage can be made to almost equal the cut-off voltage of the magnetron 10, as shown in Fig. 2.

Figure 3:
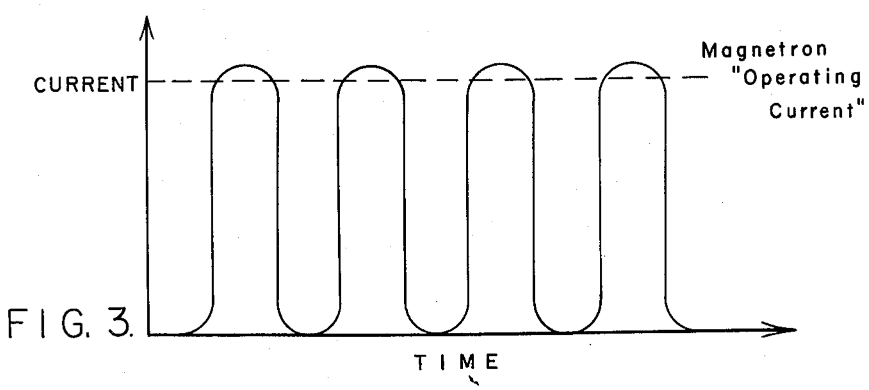
Fig. 3 is a current-time curve for a typical group of signal pulses.

If during the time the pulsed pedestal gate voltage through tube 12 is being applied to magnetron 10, the pulse generator 23 is so regulated in a well-known manner, as by a conventional timer 9, so as to apply a series of pulsed signals to grid 20 of tube 13, tube 13 will conduct pulses as shown in Fig. 3. If the pulsed signals applied to tetrode 13 are regulated by proper choice of power supplies, the tube will conduct sufficient current to drive the magnetron in the desired mode and at the desired operating point, as indicated below.

Figure 4:
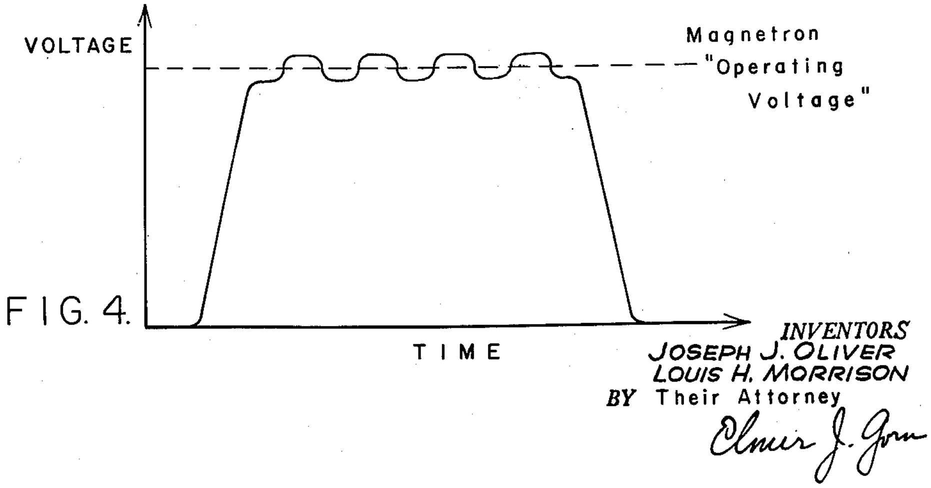
Fig. 4 is a voltage-time curve for the signal pulses of Fig. 3 being energized during the pulse period of Fig. 2.

Thus, as illustrated in Fig. 4, a single pedestal gate pulse allows the signal pulses to drive the magnetron with a minimum of energy loss. The gating pulse charges the stray capacitance of the magnetron and permits the signal pulses to be used almost entirely for transmission. We have found that with this embodiment and with proper choice of component values a magnetron can be driven at very high repetition rates with varying numbers of signal pulses in a group and yet operate in the proper mode with practically no random noise.

Although the illustrated embodiment deals with a magnetron, this invention is equally useful with any oscillator which has a high threshold conducting voltage. The tetrode was selected as the amplification means for the signal pulses because of its constant plate current characteristics. However, other amplification means may be substituted for either the triode or tetrode and still be within the purview of this invention.

Other advantages of the system of the present invention will occur to those skilled in the art to which it relates, and it is understood that changes therein may be made without the exercise of invention and within the scope of the claims appended hereto.

We claim:

1. An electrical system comprising in series a source of positive current connected to the anode of an electronic load device containing an anode and cathode and being non-conductive below a threshold cathode potential, and current-regulating means connected in circuit with said source of positive current and said electronic load device, said means including a first control tube having at least an anode, a cathode and a control electrode, means connecting said tube in circuit with said source of positive current and said electronic load device, means for applying a gating pulse to said control tube for rendering said control tube conductive to apply to said electronic load device a potential at a first non-conductive level below said threshold potential, a second control tube in circuit with said source of positive current and said load device, and means for applying a signal pulse to said second control tube to apply a potential to said electronic load device at the predetermined normal operating level of said load device.

2. An electrical system comprising a source of positive current, a radio-frequency oscillating tube non-conductive below a threshold voltage, means for generating a gating pulse voltage, a first switching means in circuit with said source of positive current and said oscillating tube, means for applying said gating pulse voltage to said first switching means to provide a voltage to said oscillating tube at a value just below said threshold voltage, means for generating a signal pulse voltage, a second switching means, means for applying said signal pulse voltage to said second switching means to provide a voltage to said oscillating tube at a predetermined value above the value of said threshold voltage, said second switching means being connected in parallel with said first switching means.

3. The combination of an electrical load device containing an anode and a cathode, a source of positive current connected to said anode, means for generating a gating pulse, means for generating a signal pulse, electronic means responsive to said gating pulse and in circuit with said source of positive current and said load device for supplying to said cathode a potential at a first level below the level sufficient for activation of said device, and further electronic means responsive to said signal pulse and connected in series relation with said electrical load device and said source of positive current and in parallel relation with said first-recited electronic means for supplying to said cathode a potential at a second level sufficient for activation of said load device.

4. The combination of an electrical load device, containing an anode and a cathode, a source of current connected to said anode, first and second electronic switching means connected in circuit with said source of current and the cathode of said load device, means for generating a gating pulse, means for generating a signal pulse, said first electronic switching means being responsive to said gating pulse to bias said cathode of said electrical load device at a first voltage level, said second electronic switching means being responsive to said signal pulse and effective when applied concurrently with said gating pulse to supply to said cathode a second voltage level sufficient for the activation of said load device.

5. The combination of an electrical load device, a source of current connected to said load device, first and second electronic switching means connected in circuit with said source of current and said load device, means for generating a gating pulse, means for generating a signal pulse, said first electronic switching means being responsive to said gating pulse to apply to said electrical load device a first voltage level below the level sufficient for activation of said device, said second electrical switching means being responsive to said signal pulse and effective when applied concurrently with said gating pulse to supply to said load device a second voltage level sufficient for activation of said load device.

References Cited in the file of this patent

UNITED STATES PATENTS

| | | |
|---|---|---|
| 2,416,361 | Young | Feb. 25, 1947 |
| 2,498,405 | Jensen | Feb. 21, 1950 |
| 2,556,181 | Hansen | June 12, 1951 |
| 2,584,509 | Spencer | Feb. 5, 1952 |
| 2,677,053 | Nims | Apr. 27, 1954 |